United States Patent [19]

Gillett

[11] Patent Number: 4,548,452
[45] Date of Patent: Oct. 22, 1985

[54] HIGH-DENSITY ELECTRICAL CONTACT PAD PATTERN

[75] Inventor: John B. Gillett, Kingston, N.Y.

[73] Assignee: International Business Machines Corporation, Armonk, N.Y.

[21] Appl. No.: 509,003

[22] Filed: Jun. 29, 1983

[51] Int. Cl.[4] .............................................. H01R 9/09
[52] U.S. Cl. ........................... 339/17 R; 339/75 MP; 339/176 MP
[58] Field of Search ............. 339/17 R, 17 B, 17 LC, 339/176 MP, 75 MP; 361/409, 410

[56] References Cited

U.S. PATENT DOCUMENTS

| | | | |
|---|---|---|---|
| 3,033,914 | 5/1962 | Acosta-Lleras | 361/409 |
| 3,302,067 | 1/1967 | Jackson et al. | 339/17 R |
| 3,399,372 | 8/1968 | Uberbacher | 339/176 MP |
| 3,703,603 | 11/1972 | Levesoue et al. | 361/409 |
| 4,095,866 | 6/1978 | Merrill | 339/17 E |
| 4,298,770 | 11/1981 | Nishihara et al. | 174/68.5 |
| 4,362,899 | 12/1972 | Borrill | 361/410 |

FOREIGN PATENT DOCUMENTS 1493718  7/1967  France ............................. 339/17 R

OTHER PUBLICATIONS

IBM Technical Disclosure Bulletin, vol. 13, No. 6, Nov. 1970, "High Density Circuits Connector" to S. M. Jensen, et al., pp. 1529-1530.

Primary Examiner—John McQuade
Attorney, Agent, or Firm—John W. Henderson, Jr.; Marilyn D. Smith; J. Jancin, Jr.

[57] ABSTRACT

A high-density printed circuit card electrical contact pad pattern that preserves card surface area while maintaining loose mechanical tolerance requirements and a high probability of contact. The invention exploits the elliptical shape of the area of high probability of contact between the contact pins of a mating connector and the card surface. The elliptical area is derived by an accumulation of mechanical tolerances associated with the card and with the pins of the mating connector. A plurality of rows of contacts are disposed along an edge of the card with each contact enclosing one elliptical area of high probability of contact. Each row is offset with respect, to, and slightly interleaved with adjacent rows.

6 Claims, 5 Drawing Figures 4,548,452

HIGH-DENSITY ELECTRICAL CONTACT PAD PATTERN

DESCRIPTION

The subject matter of this invention is disclosed but not claimed in copending application, Ser. No. 471,955, filed 3/3/83, and assigned to the same assignee as the present invention.

FIELD OF THE INVENTION

The invention relates to high density printed circuit cards and their electrical contact pads.

BACKGROUND ART

It is well known in the art that substantial force is required to insert a printed circuit board into a conventional mating edge connector due to the wiping engagement between the electrical contact pads on the board and the contact regions of the pins or springs in the mating connector. As the number of contacts increases, the force required to effect insertion also increases and will eventually reach a point where the force required will be excessive for practical use. Also, repeated insertion and extraction of a board into and from a corresponding mating connector will cause repeated wipings to occur between the contact pads and the contact springs and may result in excessive wear to the contact pads and to the contact regions of the contact springs.

A common solution to this problem is the zero insertion force (ZIF) type connector. In these connectors, the contact pins located in the connector are movable between two positions. In the first position, the pins are retracted from the board insertion path thereby allowing the unobstructed and low force insertion of the printed circuit board into the connector. In the second position, the contact pins are moved by an actuator into engaging contact with the contact pads of the board.

When designing a zero insertion force connector, mechanical tolerances of the printed circuit board and of the mating connector must be considered. These mechanical tolerances stem from unavoidable manufacturing deviations from piece to piece and from lot to lot as well as variations in mechanical dimensions due to environmental operating conditions. A prudent design of a zero insertion force connector intended for large volume production will ensure that every printed circuit board can mate with every connector under a worst-case accumulation of mechanical tolerances. Further, previous connectors have oppositely aligned contact pins which, under a worst-case design, will cause the contact pins of a dimensionally nominal connector to touch the opposite facing pins when the pins are actuated in the absence of a printed circuit board in the connector. This invention avoids such problems.

In a modular or expandable system using a plurality of zero insertion force connectors, often several of the connectors are vacant, i.e., without printed circuit boards. Esthetics or other constraints often require these vacant connectors to be in the actuated or closed state. If the opposite facing contact pins of the vacant and closed connectors touch each other thereby producing electrical short circuits, damage to the remaining electrical circuitry may result or erroneous signals may be generated.

It is therefore desirable to provide a zero insertion force type electrical connector that will not cause opposite facing contact pins to contact and short circuit when the pins are actuated in the absence of a printed circuit board within the connector. This connector must also maintain a conservative worst-case design philosophy to ensure compatability between any board/connector combination.

It is also desirable to minimize the printed circuit board surface area devoted to electrical connections, thereby preserving valuable space for board mounted electrical components. At the same time, these electrical connections should be arranged so that a high probability of contact is maintained to ensure reliable operation.

SUMMARY OF THE INVENTION

The invention as herein described and claimed will resolve the drawbacks of the prior art. It solves the problem of providing a zero insertion force printed circuit board edge connector that will ensure electrical connection under a worst-case accumulation of mechanical tolerances while precluding the short circuiting of connector contact pins when the connector is actuated in the absence of a board within the connector. The invention includes a unique connector contact pin configuration and a unique contact pad pattern for the edge of the mating printed circuit board.

Self-biased, spring-like contact pins of the connector are formed so that the contact regions of the contact pins lie in at least two horizontal planes. The longer pins located on one side of the connector are located opposite the shorter pins on the other side of the connector. When the connector is actuated in the absence of a printed circuit board, the short pins will move under the opposing long pins but the pins will not contact or short circuit. During actuation, contact regions of the the pins will move more than half way across the connector opening, thereby assuring a wiping contact with and electrical connection to any card regardless of dimensional tolerance or of card position within the connector opening.

The formed pins will mate with a unique pattern of contact pads disposed along at least one edge of the printed circuit board. The rows of contact pads are offset and slightly interleaved in order to minimize the board area required for electrical connections while maintaining a high probability of contact.

The foregoing and other objects, features, and advantages of the invention will be apparent from the following more particular description of the preferred embodiments of the invention, as illustrated in the accompanying drawing.

DESCRIPTION OF THE INVENTION

Figure 1:
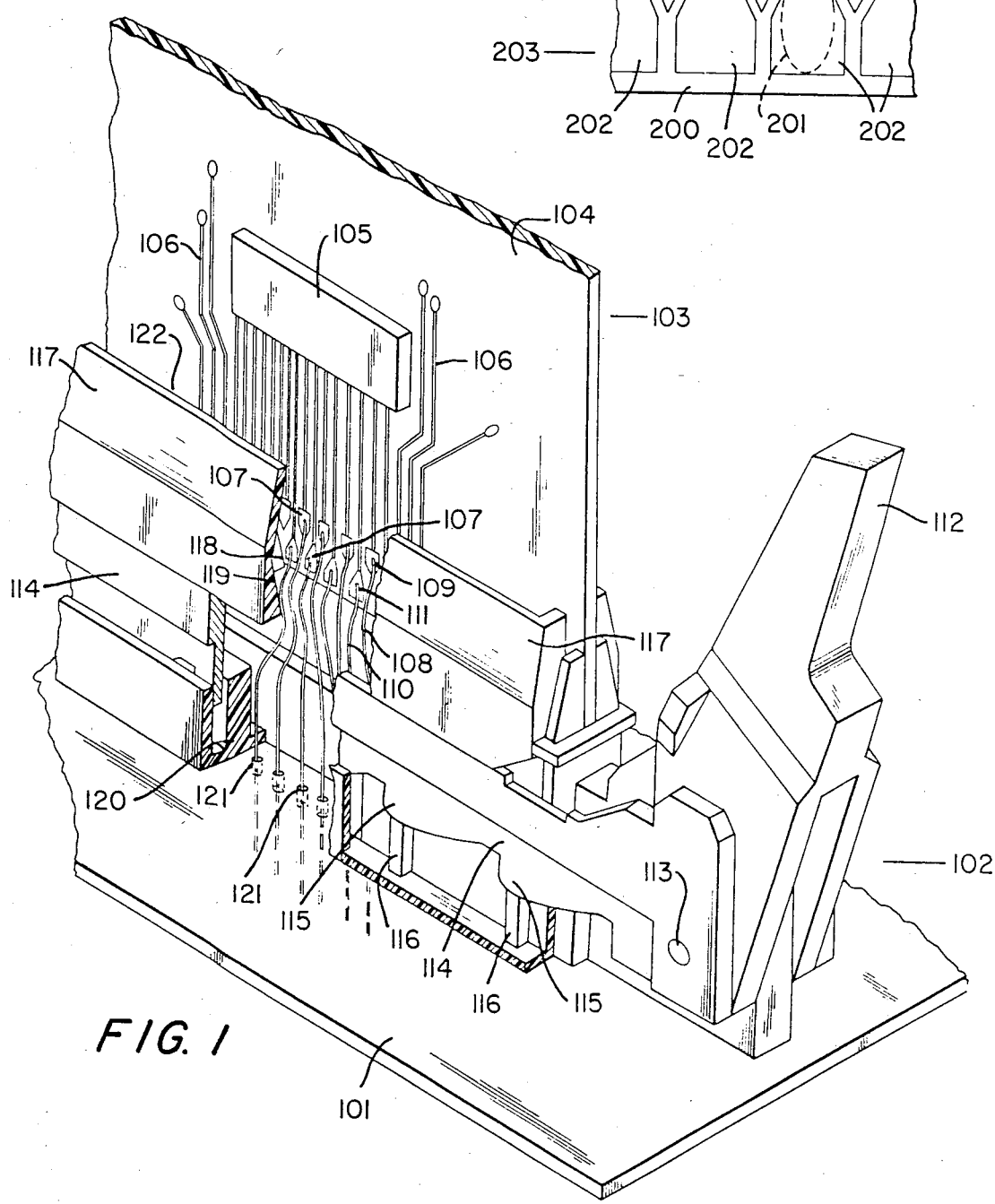
FIG. 1 is a ZIF type connector in partial cross section showing a row of electrical contact pins and a printed circuit board with a two row contact pad pattern.

Referring to FIG. 1, mother board 101 has mounted thereon a connector 102 of the zero insertion force (ZIF) type. Connector 102 is shown in partial cross-section to better illustrate the internal actuator mechanism. ZIF connector 102 is used to make electrical contact between printed circuit board unit 103 and mother board 101. Printed circuit board unit 103 includes a printed circuit board 104 with electrical components 105 mounted thereon. Although only one electrical component 105 is shown in FIG. 1, it will be understood that more than one component 105 can be mounted on printed circuit board 104. Circuit traces 106 are used to electrically connect components 105 with each other and with electrical contact pads 107 disposed in rows along the edge of printed circuit board 104.

Electrical contact pads 107 are shown in FIG. 1 arranged in two rows near the edge of printed circuit board 104. Long electrical contact pins 108 have contact regions 109 for contacting pads 107 located in the row farthest from the edge of printed circuit board 104. Short electrical contact pins 110 have contact regions 111 for contacting pads 107 located in the row nearest to the edge of printed circuit board 104.

Actuating handle 112 of connector 102 pivots about hinge pin 113 and moves linear cam 114 longitudinally of connector 102. When handle 112 pivots in a counterclockwise direction, linear cam 114 moves to the right parallel to the longitudinal dimension of connector 102. When handle 112 pivots in a clockwise direction, linear cam 114 moves to the left.

Linear cam 114 includes cam lobes 115 which ride on cam followers 116 during the motion of linear cam 114. The interaction between cam followers 116 and cam lobes 115 during the motion of linear cam 114 causes linear cam 114 to move perpendicular with the surface of mother board 101 thereby moving housing 117 in the same direction.

Housing 117 is made of an electrically insulating material and is formed with an elongated opening 122 at the top thereof. Printed circuit board unit 103 is received into housing 117 through elongated opening 122 along a board insertion path. The board insertion path can be generally described as a vertical plane passing through elongated opening 122 and oriented substantially parallel with the longitudinal dimension of elongated opening 122.

Housing 117 contains upper inclined surfaces 118 that cooperate with long contact pins 108 and lower inclined surfaces 119 that cooperate with short contact pins 110. As housing 117 is urged by linear cam 114 to move away from mother board 101, inclined surfaces 118 and 119 move electrical contact pins 108 and 110, respectively, toward electrical contact pads 107 located on printed circuit board 104. Electrical contact pins 108 and 110 are self-biased to assume a normal position retracted from printed circuit board 104 and as housing 117 moves toward mother board 101, electrical contact pins 108 and 110 move away from printed circuit board 104. In this manner, electrical contact pins 108 and 110 move into and out of contact with pads 107 as handle 112 is pivoted.

Electrical contact pins 108 and 110 extend through base portion 120 of ZIF connector 102 and through vias 121 in mother board 101. Vias 121 are typically connected to circuit traces (not shown) disposed on the surface of mother board 101. These traces serve to make electrical connections between pins 108 and 110 and electronic circuitry located elsewhere on mother board 101.

Another row of contact pins within housing 117, similar to pins 108 and 110, is located on the hidden side of printed circuit board unit 103 in FIG. 1. This other row is also moved into and out of contact with electrical contact pads located along the edge of the hidden surface of printed circuit board 104 as handle 112 is pivoted. The configuration of opposing pin rows will be detailed in FIG. 3.

Here it should be noted that the particular actuator mechanism in ZIF connector 102, used to urge pins 108 and 110 toward printed circuit board 104, herein described and illustrated in FIG. 1, is but one of several possible mechanisms that are well known to one skilled in the art. The presentation of this particular actuation mechanism is for illustrative purposes only and should not be construed to limit the scope of the claimed invention.

Figure 2:
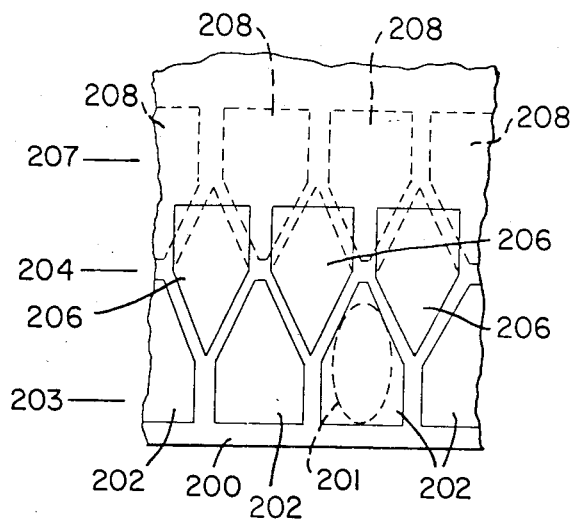
FIG. 2 is a two row electrical contact pad pattern and a three row electrical contact pad pattern disposed on the edge of a printed circuit board.

FIG. 2 illustrates an offset and interleaved electrical contact pad pattern disposed along the edge of a printed circuit board 200 according to this invention.

The pad pattern is based on the understanding that the ideal target area for a contact pin to touch and wipe a contact pad is an elliptical area 201. This elliptical area 201 is derived by statistical mechanical tolerance analysis techniques, which techniques are well known to one skilled in the art.

FIG. 1 will be used to illustrate the application of the statistical mechanical tolerance analysis techniques to a connector/board combination.

For manufacturing purposes pins 108 and 110 have a specified nominal vertical length. In order to facilitate the manufacture of connector 102 and mating printed circuit board unit 103, this nominal vertical length has an acceptable positive and negative deviation which is typically called tolerance.

The tolerance is usually indicated for each length or other specified quantity on a mechanical drawing used in the manufacture and mechanical specification of connector 102 or board unit 103. Tolerances are associated with both horizontal and vertical dimensions.

Contact regions 109 and 111, associated with contact pins 108 and 110, respectively, also have a specified nominal vertical position with acceptable mechanical tolerances. At the same time, contact regions 109 and 111 have a nominal horizontal position with a horizontal tolerance. In a like manner, contact pads 107 on the surface of printed circuit board 104 have specified nominal locations with acceptable vertical and horizontal tolerances. Also, the dimensions of printed circuit board 104 have horizontal and vertical tolerances as does the mating position of printed circuit board 104 within connector 102.

The aforementioned dimensions associated with pins 108 and 110, board 104, and pads 107 combine to determine the point of contact between contact regions 109 and 111 and contact pads 107 on the surface of board 104.

If all of the mechanical dimensions are set to their nominal values, contact regions 109 and 111 will each contact the surface of printed circuit board 104 at one single point. Referring to FIG. 2, this single point is the center of elliptical area 201.

If only the aforementioned vertical tolerances are considered, contact regions 109 and 111 will again each contact the surface of board 104 at a single point, but this single point will be located along a vertical line on the surface of printed circuit board 104. Referring to FIG. 2, this vertical line is the major axis of elliptical area 201.

If only the aforementioned horizontal tolerances are considered, contact regions 109 and 111 will each contact the surface of board 104 at a single point located along a horizontal line on the surface of board 104. In FIG. 2, this horizontal line is the minor axis of elliptical area 201.

When both horizontal and vertical tolerances are considered at the same time, the entire elliptical area 201 results. Area 201 represents an area of high probability of contact between a pin contact region of a mating connector and the surface of printed circuit board 200.

The length of the major axis of elliptical area 201 is the sum of all vertical tolerances affecting the relative vertical positions of a pin contact region and the board surface. The length of the minor axis of elliptical area 201 is the sum of all horizontal tolerances affecting the relative horizontal positions of a pin contact region and a board surface.

In the illustrated embodiment shown in FIG. 2, elliptical area 201 is oriented so that the major axis is substantially perpendicular with the edge of printed circuit board 200. This orientation results primarily from the vertical wiping action that occurs during contact between the pin contact regions of a mating connector and the surface of board 200.

If the wiping action of the pin contact regions were horizontal, i.e., parallel with the edge of printed circuit board 200, elliptical area 201 would be oriented so that the minor axis is substantially perpendicular to the edge of printed circuit 200.

If there were no wiping action between the pin contact regions and the surface of board 200, area 201 may even assume a circular shape.

In FIG. 2, the border (dashed line) of elliptical area 201 represents a contour of equal probability of contact between a contact pin and the surface of printed circuit board 200. Area 201 represents the area of high probability of contact while the area outside of area 201 represents the area of low probability of contact. A particular area 201 is chosen according to the requirements of the particular printed circuit board and connector application. If a small elliptical area 201 is chosen, electrical contact pads 202 can be closely spaced but at the cost of reducing the probability of electrical contact. If a large area 201 is chosen, the probability of electrical contact will increase but electrical contact pads 202 will be required to be spaced further apart.

A two row pad pattern is shown in solid lines in FIG. 2. Row 203 is located nearest the edge of printed circuit board 200 and row 204 is located farthest from the edge. Each individual contact pad 202 and 206 encloses a single elliptical area 201. The edges of pads 202 and 206 are straight lines in order to facilitate the layout of printed circuit board 200.

As illustrated in FIG. 2, pads 206 of row 204 are slightly interleaved with and offset with respect to pads 202 of row 203. Offsetting and interleaving the pad patterns in this manner allows row 204 to be located closer to the edge of printed circuit board 200 thereby reducing the area required for electrical connections while preserving the remaining interior area of printed circuit board 200 for the mounting of electrical components.

For the purposes of this invention, interleaving signifies an overlap between the vertical axes (i.e., perpendicular with the edge of printed circuit board 200) of the elliptical areas of adjacent rows of contacts. This interleaving results in the combined width of two adjacent rows being less than double the length of the vertical axis of area 201. As a result, each enclosed elliptical area is spaced apart from adjacent enclosed elliptical areas within the same row a distance less than the length of the minor axis of each elliptical area.

A third row 207 of electrical contact pads 208 can be added as shown by dashed lines in FIG. 2. In order to accommodate row 207, pads 206 must be modified to the diamond-shape shown in dashed lines. In a three row pad pattern each individual pad (202, 206, 208) contains an elliptical area 201 of high probability of contact.

The pads 208 of third row 207 are slightly interleaved with an offset with respect to pads 206 of row 204. Once again, this allows third row 207 to be located closer to the edge of printed circuit board 200 thereby preserving the remaining interior area of printed circuit board 200 for the mounting of electrical components.

Any number of rows of electrical contact pads can be added in the same manner as the addition of row 207 herein described. The favorable overall effect of this new pad pattern is to minimize the printed circuit board area required for electrical connection while maintaining a high probability of making contact between contact pins and contact pads.

Figure 3A:
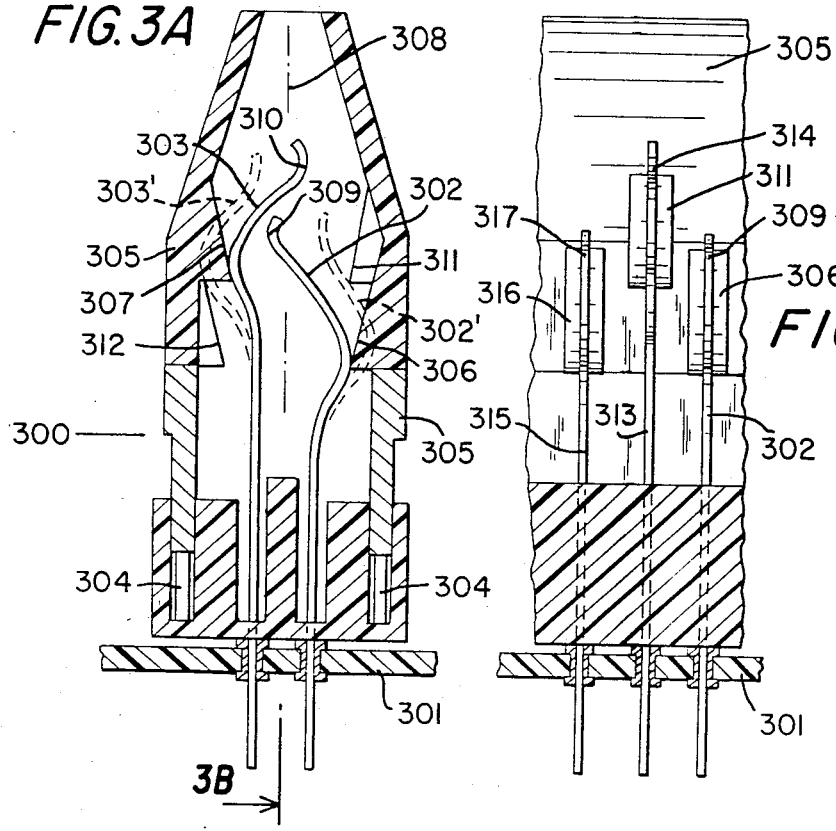
FIG. 3A is a cross section of a connector like that in FIG. 1 illustrating the actuation sequence of a pair of opposing contact pins with certain other pins removed for clarity.
Figure 3B:
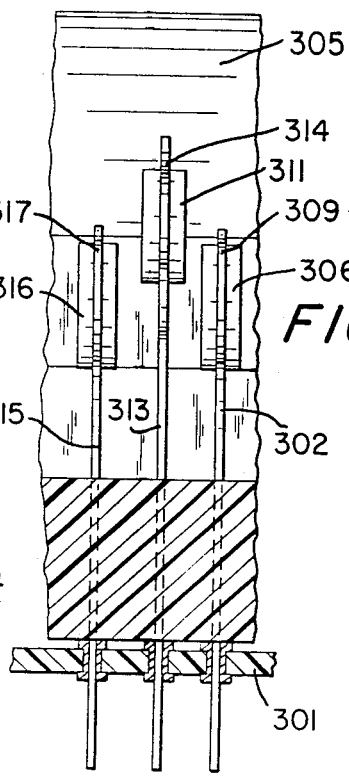
FIG. 3B is a view of the connector of FIG. 3A taken through section 3B—3B.

Referring to FIGS. 3A and 3B, a ZIF connector 300 mounted to mother board 301, is shown in cross-section and is similar to ZIF connector 102 shown in FIG. 1. In FIGS. 3A and 3B, the printed circuit board unit is removed from connector 300 and short contact pin 302 and long contact pin 303 are shown opposite each other. ZIF connector 300 is shown in the actuated position as linear cams 304 urge housing 305 away from mother board 301. Inclined surfaces 306 and 307, contained within housing 305, force short contact pin 302 and long contact pin 303, respectively, toward the center line 308 of connector 300. Center line 308 is substantially coplanar with the board insertion path described during the discussion of FIG. 1.

In FIG. 3A, contact regions 309 and 310 of contact pins 302 and 303, respectively, have passed through center line 308 but as shown in FIG. 3A, they do not touch one another. Contact region 309 of short pin 302 is under contact region 310 of long contact pin 303.

Here it should be noted that not all of the contact regions of all of the opposed contact pin pairs of every connector must pass through center line 308. The mechanical tolerances mentioned earlier may accumulate such that none or only some of the contact regions pass through center line 308 in any one given connector of a production lot. However, in another given connector, mechanical tolerances may accumulate such that all contact regions of all opposed contact pin pairs pass through center line 308. The offset pin configuration herein described and claimed will guarantee that no opposed pins will touch and short circuit in any connector of the production lot.

Contact pins 302' and 303' show the positions of pins 302 and 303, respectively, when they are in the self-biased, retracted position thereby clearing center line 308 allowing a printed circuit board unit to enter connector 300. Pins 302 and 303 assume the retracted positions of 302' and 303' when linear cam 304 is moved thereby allowing housing 305 to move closer to mother board 301.

Inclined surfaces 311 and 312 are contained within housing 305 and serve to move the set of contact pins adjacent pins 302 and 303. This set of adjacent pins is not shown in FIG. 3A in order to eschew obfuscation.

FIG. 3B is a view taken through sections 3B—3B of FIG. 3A. In FIG. 3B, long pin 313 is shown adjacent short pin 302. Inclined surface 311 is attached to housing 305 and serves to move long pin 313 when housing 305 is moved by linear cam 304. Long pin 313 has a contact region 314 that lies substantially in a first horizontal plane with contact region 310 of long pin 303 shown in FIG. 3A. The contact regions of all remaining long contact pins in ZIF connector 300 also substantially lie in this first horizontal plane.

Adjacent long pin 313 in FIG. 3B is short pin 315 with cooperating inclined surface 316 attached to housing 305. Contact region 317 of short pin 315 substantially lies in a second horizontal plane with contact region 309 of short pin 302. The contact regions of all remaining short pins in ZIF connector 300 also substantially lie in this second horizontal plane.

The preferred configuration of alternating long pins and short pins within a single row is shown in FIG. 3B and also in FIG. 1. In FIG. 3, contact regions are shown to lie in only two horizontal planes because the connector illustrated in FIG. 3 is disposed to contact and wipe a two row pad pattern (e.g., rows 203 and 204 of FIG. 2). In order to contact and wipe a three row pad pattern (e.g., rows 203, 204, and 207 of FIG. 2) the contact regions of the contact pins would lie substantially in three different horizontal planes and the contact pins would be of three different lengths. This is illustrated in FIG. 4.

In general, the contact regions of the contact pins will substantially lie in a number of horizontal planes equal to the number of contact pad rows on the corresponding mating printed circuit board. Also, due to the alternating pin lengths hereinbefore described, the contact regions of the pins will be distributed among these horizontal planes in substantially equal proportion.

Figure 4:
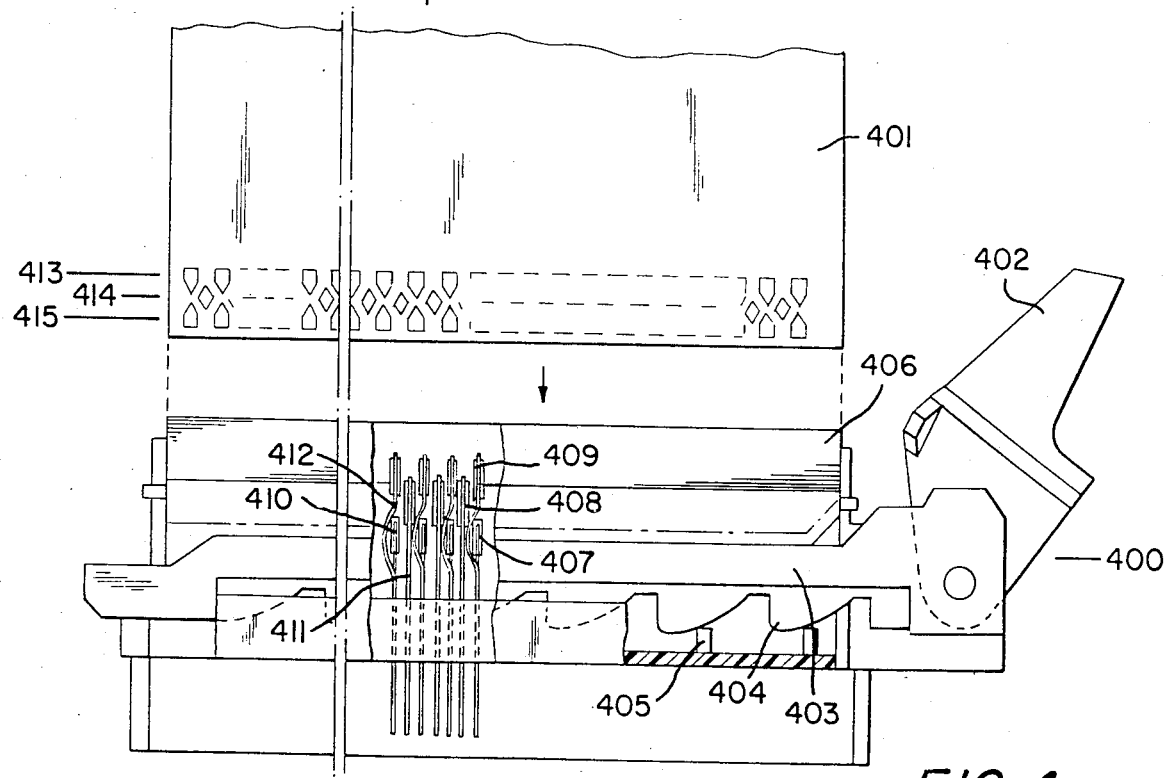
FIG. 4 is a ZIF type connector in partial cross section showing a row of electrical contact pins and a printed circuit board with a three row electrical contact pad pattern.

FIG. 4 shows a ZIF connector 400 in partial cross section with a corresponding printed circuit board 401. ZIF connector 400 includes an actuator mechanism comprising the following elements: handle 402, linear cam 403 with cam lobes 404, cam followers 405, and housing 406. The components of this actuator mechanism cooperate in the same manner as the actuator mechanism of FIG. 1 to move housing 406 upward as handle 402 pivots counterclockwise. Once again, the illustration of this particular actuator mechanism should not be construed to delimit the invention in any manner.

Housing 406 contains inclined surfaces 407, 408 and 409 that cooperate with short pins 401, mid-length pins 411, and long pins 412, respectively. As housing 406 moves upward in response to the counterclockwise pivoting of handle 402, inclined surfaces 407, 408, and 409 move pins 410, 411 and 412, respectively, toward printed circuit board 401 when printed circuit board 401 is inserted into ZIF connector 400.

Long pins 412 are disposed to contact and wipe electrical contact pads in row 413 located along the edge of printed circuit board 401. Mid length pins 41 are disposed to contact and wipe electrical contact pads in row 414 located along the edge of printed circuit board 401. Short pins 410 are disposed to contact and wipe electrical contact pads in row 415 located along the edge of printed circuit board 401.

Once again, the contact regions of the contact pins pass through the planar board insertion path when connector 400 is actuated in the absence of printed circuit board 401 within connector 400. In order to avoid contact between opposing pins, a mid length pin is located opposite a short pin and a long pin so that the contact region associated with the mid length pin will pass over the top of the contact region associated with the opposing short pin, and will pass under the contact region associated with the opposing long pin. In this manner, the contact regions of opposing pins will not touch and short circuit when ZIF connector 400 is actuated in the absence of printed circuit board 401 within connector 400.

This scheme of opposing contacts can be expanded to encompass a ZIF connector capable of contacting a printed circuit board with any number of rows of contact pads disposed along an edge thereof. Short circuiting of opposing contact pins is precluded by ensuring that each contact pin in the connector is never opposite a contact pin of equal length having a contact region in the same horizontal plane.

It will be understood that the preferred embodiment herein presented is for illustrative purposes, and, as such, will not be construed to place limitations on the invention. Those skilled in the art will understand that changes in the form and detail of the preferred embodiment recited may be made without departing from the spirit and scope of the invention.

I claim:

1. A high-density electrical contact pad pattern positioned along at least one edge of a flat surface of an electronic component for connecting with a zero-insertion-force type connector, said connector including contact pins having corresponding contact regions each region disposed to contact and wipe one of said contact pads in a direction substantially perpendicular with said at least one edge of said electronic component during the actuation sequence of said connector, said contact pad pattern comprising:

a first row and a second row of electrically insulated contact pads, aligned substantially parallel with the edge of said flat surface, each one of said contact pads enclosing a substantially identical respective elliptical area of high probability of contact with a corresponding contact region, each contact pad oriented so that the major axis of the respective enclosed elliptical area is substantially parallel with the direction of wipe of the corresponding contact region;

wherein said second row of contact pads is offset with respect to and interleaved with said first row of contact pads, and wherein each enclosed elliptical area is spaced apart from adjacent enclosed elliptical areas within the same row a distance less than the length of the minor axis of each said elliptical area.

2. A contact pad pattern according to claim 1 wherein said electronic component is a printed circuit board.

3. A high-density electrical contact pad pattern as recited in claim 1 wherein the length of the major axis and minor axis of elliptical area are proportional to the sum of the vertical and horizontal mechanical tolerances, respectively, affecting the relative positions of a contact pad and a corresponding contact region.

4. A high-density electrical contact pad pattern positioned along at least one edge of a flat surface of an electronic component for connecting with a zero-insertion-force type connector, said connector including contact pins having corresponding contact regions each region disposed to contact and wipe one of said contact pads in a direction substantially perpendicular with said at least one edge of said electronic component during the actuation sequence of said connector, said contact pad pattern comprising:

a plurality of rows of electrically insulated contact pads aligned substantially parallel with the edge of said flat surface, each one of said contact pads enclosing a substantially identical respective elliptical area of high probability of contact with a corresponding contact region, each contact pad oriented so that the major axis of the respective enclosed elliptical area is substantially parallel with the direction of wipe of the corresponding contact region; and wherein each row of contact pads is offset with respect to and interleaved with each immediately adjacent row of contact pads, and wherein each enclosed elliptical area is spaced apart from adjacent enclosed elliptical areas within the same row a distance less than the length of the miror axis of each said elliptical area.

5. A contact pad pattern according to claim 4 wherein said electronic component is a printed circuit board.

6. A high-density electrical contact pad pattern as recited in claim 4 wherein the length of the major axis and minor axis of elliptical area are proportional to the sum of the vertical and horizontal mechanical tolerances, respectively, affecting the relative positions of a contact pad and a corresponding contact region.

* * * * *

UNITED STATES PATENT AND TRADEMARK OFFICE
CERTIFICATE OF CORRECTION

PATENT NO. : 4,548,452

DATED : October 22, 1985

INVENTOR(S) : J.B. Gillett

It is certified that error appears in the above-identified patent and that said Letters Patent is hereby corrected as shown below:

```
Column 8, line 67, after "axis of" insert -- each --.
Column 10, line 15, after "axis of" insert -- each --.
```

Signed and Sealed this

Twenty-first Day of January 1986

[SEAL]

Attest:

Attesting Officer

DONALD J. QUIGG

Commissioner of Patents and Trademarks